US012588511B2

(12) United States Patent
Khoo et al.

(10) Patent No.: US 12,588,511 B2
(45) Date of Patent: Mar. 24, 2026

(54) SHIELDING ASSEMBLY FOR SEMICONDUCTOR PACKAGES

(71) Applicant: Intel Corporation, Santa Clara, CA (US)

(72) Inventors: Poh Boon Khoo, Pulau Pinang (MY); Jiun Hann Sir, Pulau Pinang (MY); Min Suet Lim, Pulau Pinang (MY); Seok Ling Lim, Kedah (MY); Yew San Lim, Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 748 days.

(21) Appl. No.: 17/857,053

(22) Filed: Jul. 4, 2022

(65) Prior Publication Data

US 2024/0006338 A1     Jan. 4, 2024

(51) Int. Cl.
| | |
|---|---|
| *H01L 23/48* | (2006.01) |
| *H01L 21/48* | (2006.01) |
| *H01L 23/498* | (2006.01) |
| *H01L 23/52* | (2006.01) |
| *H01L 23/552* | (2006.01) |

(52) U.S. Cl.
CPC ........ *H01L 23/552* (2013.01); *H01L 21/4853* (2013.01); *H01L 23/49816* (2013.01)

(58) Field of Classification Search
CPC ............... H01L 23/552; H01L 21/4853; H01L 23/49816; H01L 23/13; H01L 23/50
USPC ........................................................ 257/737
See application file for complete search history.

(56) References Cited

U.S. PATENT DOCUMENTS

2016/0020164 A1 *   1/2016   Terui ..................... H01L 21/486
                                                                    174/251
2018/0226364 A1 *   8/2018   Kim .................. H01L 23/49827

* cited by examiner

*Primary Examiner* — Theresa T Doan
(74) *Attorney, Agent, or Firm* — Viering, Jentschura & Partner mbB

(57)     ABSTRACT

A semiconductor package including a package substrate including a bottom surface; a first plurality of solder balls connected to the bottom surface of the package substrate; a second plurality of solder balls connected to a motherboard; and a shielding assembly interposed between the first and the second plurality of solder balls and configured to shield each solder ball of the first and second plurality of solder balls from electromagnetic interference.

12 Claims, 12 Drawing Sheets

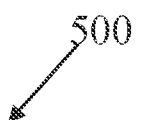

500

501 —
forming a shielding assembly, the formation of the shielding assembly including providing a shielding layer with a top surface and a bottom surface; and forming a first plurality of cavities in the top surface and an aligned second plurality of cavities in the bottom surface of the shielding layer, wherein a plurality of protrusions remain between the cavities 502 —
filling the cavities with an insulating material 503 —
partially removing the insulating material, wherein the insulating material that remains forms an insulating layer surrounding each of the protrusions 504 —
affixing a second plurality of solder balls into the second plurality of cavities formed in the bottom surface of the shielding layer 505 —
affixing the shielding assembly to a first plurality of solder balls coupled to a bottom surface of a package substrate such that each of the protrusions on the top surface of the shielding assembly expands into a space between each solder ball of the first plurality of solder balls

SHIELDING ASSEMBLY FOR SEMICONDUCTOR PACKAGES

BACKGROUND

As the form-factor of semiconductor packages continues to shrink to achieve system miniaturization for personal computing devices, the silicon device dimensions need to be scaled adequately. The reduction in thickness may lead to crosstalk coupling in the semiconductor packages, resulting in electrical performance degradation, especially for advanced high-speed electronic semiconductor packages.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 5 shows a simplified flow diagram for an exemplary method for making semiconductor packages according to an aspect of the present disclosure;

DETAILED DESCRIPTION

A problem encountered in semiconductor packages, particularly for advanced high-speed electronic semiconductor packages, is electrical performance degradation due to miniaturization. For example, to reduce a package footprint, the pitch dimension of solder ball grid arrays are being reduced (e.g., to below 400 μm). Problems associated with the reduction of the pitch dimension of solder ball grid arrays, however, are often accompanied by an increased unintentional coupling of activity between neighboring solder balls (e.g., an increase in crosstalk noises) which may cause electrical performance degradation.

Figure 1A:
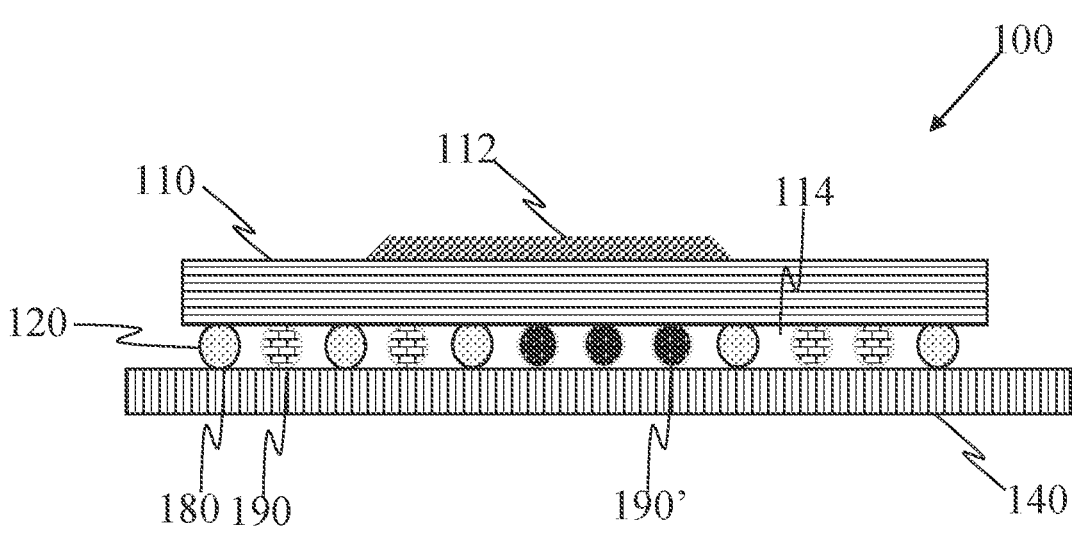
FIG. 1A illustrates a cross-sectional view of a conventional semiconductor package.
Figure 1B:
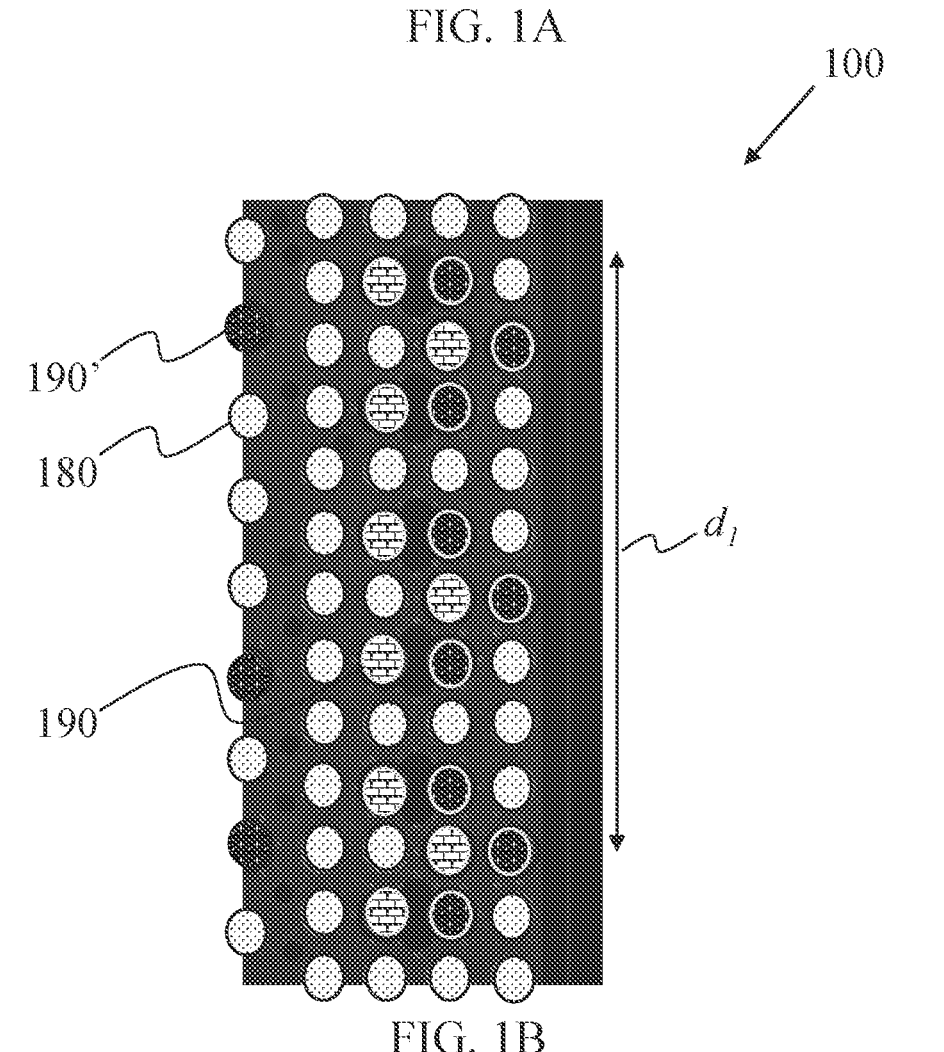
FIG. 1B illustrates a bottom view of a ball grid array in a conventional semiconductor package.

In a previous attempt to reduce the crosstalk between solder balls, a high amount of solder balls associated with ground reference voltage may be employed as depicted, for example, in FIG. 1A. In FIG. 1A, a package substrate 110 includes a bottom surface and a plurality of solder balls 120 connected at a top surface of each solder ball of the plurality of solder balls to the package substrate 110 and connected to a motherboard 140 at a bottom surface of each solder ball of the plurality of solder balls. The plurality of solder balls may include a first set of solder balls 180 that are associated with a ground reference voltage and a second set of solder balls 190, 190' that are associated with a power supply voltage (including signal transmission). In the conventional semiconductor package 100, there is an open space 114. Due to the problems associated with crosstalk when the distance between each solder ball and its adjacent solder ball is too short, this open space is unutilized. In addition, a high ratio of solder balls associated with a ground reference voltage 180 may be used in conventional systems to reduce the crosstalk. As illustrated in FIG. 1B, a ratio of the solder balls 180 to the solder balls 190, 190' is approximately 1:1, and a distance along the line $d_1$ is approximately 6.3 mm.

A disadvantage associated with this approach includes significant challenges in achieving a desired form-factor, since the amount of solder balls that are associated with a ground reference voltage consume space on the motherboard and package substrate, thereby reducing the available footprint.

Figures 2A, 2B, 2C:
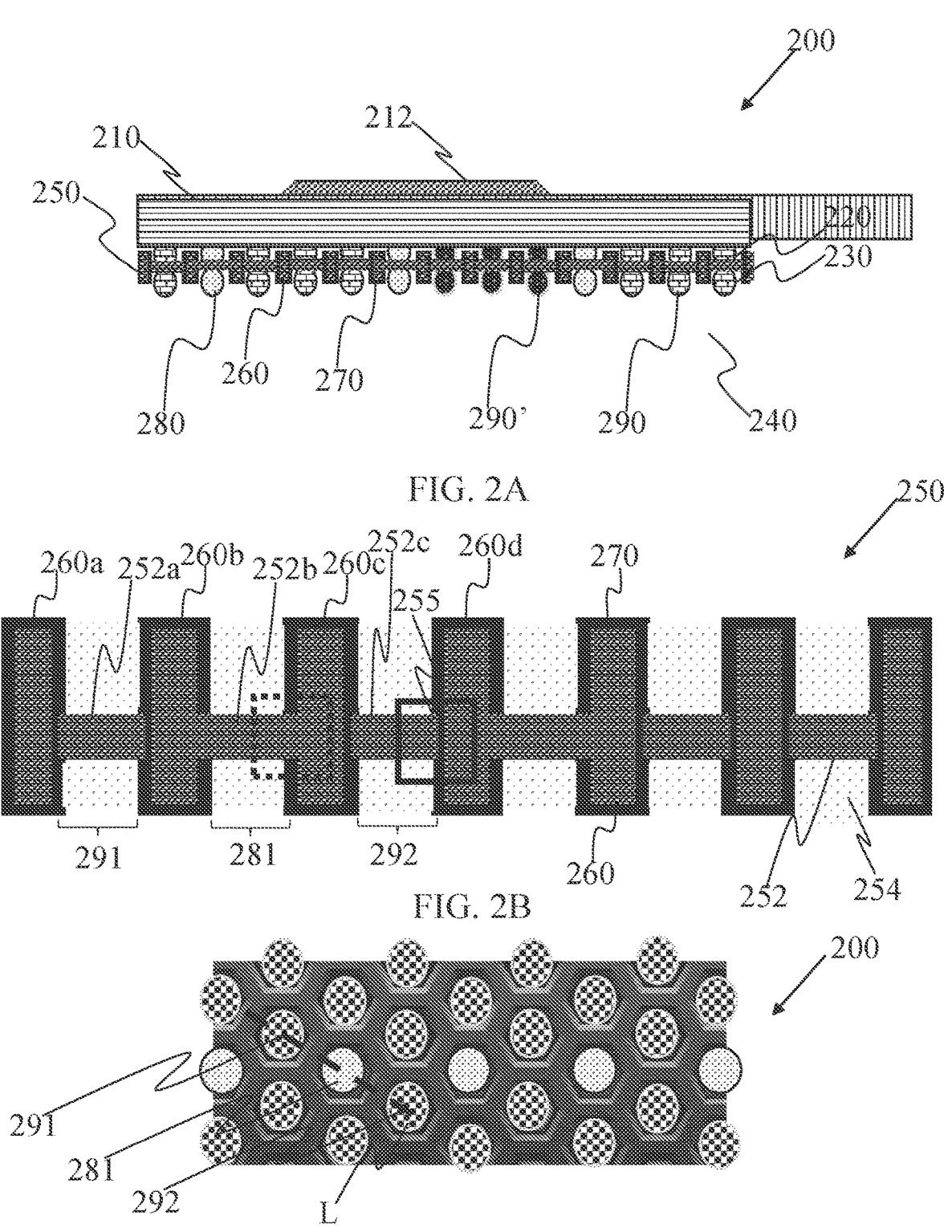
FIG. 2A illustrates a cross-sectional view of a semiconductor package in accordance with an aspect of the disclosure.
FIG. 2B illustrates an enlarged view of the shielding assembly in accordance with an aspect of the disclosure.
FIG. 2C illustrates a bottom view of a ball grid array of a semiconductor device in accordance with an aspect of the disclosure.

To address these shortcomings, as illustrated in FIG. 2A and FIG. 2B, there is disclosed a semiconductor package 200 including: a package substrate 210 including a bottom surface. The semiconductor package 200 may further include a first plurality of solder balls 220 connected to the bottom surface of the package substrate 210. The semiconductor package 200 may further include a second plurality of solder balls 230 connected to a motherboard 240. The semiconductor package 200 may further include a shielding assembly 250 interposed between the first and the second plurality of solder balls 220, 230, wherein the first plurality of solder balls 220 may be disposed on a top surface of the shielding assembly 250 and the second plurality of solder balls 230 may be disposed on a bottom surface of the shielding assembly 250, wherein each of the solder balls of the first plurality of solder balls 220 may be oppositely aligned with a corresponding solder ball of the second plurality of solder balls 230 to form a coupled pair of solder balls 235. The shielding assembly 250 may include a plurality of protrusions 260 extending from a top surface and from a bottom surface of the shielding assembly 250 into a space 254 between each solder ball of the first and second plurality of solder balls 220, 230. Each protrusion of the plurality of protrusions 260 may be covered with an insulating layer 270 configured to insulate each of the solder balls of the first and the second plurality of solder balls 220, 230.

Advantageously, since the package substrate 210 has a shielding assembly 250, additional VSS shielding and isolation for power supply voltage connections, in particular those associated with signal data transmission (I/O), is provided. This has the benefit of allowing a reduced number of solder balls associated with ground reference voltage, that were in conventional systems engaged to reduce the cross-talk between adjacent solder balls.

A further advantage is obtained by the ability to reduce the size of the solder balls to achieve the same height, which may reduce the ball pitch (the distance from one solder ball to the next), thereby leading to a smaller footprint of the semiconductor package 200.

FIG. 2A is a cross-sectional view of a semiconductor package 200, according to aspects of the present disclosure. FIG. 2B is an enlargement of the shielding assembly 250 of FIG. 2A.

In detail, FIG. 2A is a cross-sectional view of the semiconductor package 200. Referring to FIGS. 2A and 2B, the semiconductor package 200 may include a package substrate 210 including a bottom surface on which a first plurality of solder balls 220 are disposed. The bottom surface of the package substrate 210 may refer to the surface that may face the motherboard 240. Opposite the bottom surface of the package substrate 210 may be a top surface of the package substrate 210, on which electrical components, such as a base die 212, may be disposed.

The package substrate 210 may include typical substrate materials. For example, the package substrate 210 may include an epoxy-based laminate substrate having a core layer for mechanical support and/or build-up layers. In one aspect, the package substrate 210 may include a coreless substrate i.e., an epoxy-based laminate substrate, and/or build-up layers without a rigid core layer. The package substrate 210 may include other suitable types of substrates in other aspects. For example, the package substrate 210 may include any suitable semiconductor material (e.g., silicon, gallium, indium, germanium, or variations or combinations thereof, among other substrates), one or more insulating layers, such as glass-reinforced epoxy, such as FR-4, polytetrafluoroethylene, cotton-paper reinforced epoxy, phenolic-glass, paper-phenolic, polyester-glass, Ajinomoto Build-up Film, any other dielectric material, such as bisma-leimide-triazine epoxy resin, or any combination thereof, such as can be used in electronic package substrate and/or printed circuit boards (PCBs).

The first plurality of solder balls 220 may be connected to the bottom surface of the package substrate 210. For example, a contact pad (not shown) may be disposed between the package substrate 210 and each of the solder balls of the first plurality of solder balls 220, establishing an electric connection.

The second plurality of solder balls 230 may be connected to the top surface of the motherboard 240. For example, a contact pad (not shown) may be disposed between the motherboard 240 and each of the solder balls of the second plurality of solder balls 230, establishing an electric connection.

The shielding assembly 250 may refer to a modified layer that may be disposed substantially parallel to the bottom surface of the package substrate 210. In particular, shielding assembly 250 may be (vertically) interposed between the first plurality of solder balls 220 and the second plurality of solder balls 230. The shielding assembly 250 may function as a "shielding wall" that is configured to reduce unintentional coupling of activity between neighboring solder balls (e.g., an increase in crosstalk noises). The effect of the "shielding wall" may be caused by a plurality of protrusions 260, extending from each of a top surface of the shielding assembly 250 and a bottom surface of the shielding assembly 250.

The semiconductor package 200 may further include a base die 212 disposed on a top surface of the package substrate 210. The base die 212 may include a silicon interposer or a stack-up of metal redistribution layers including transistor devices (not shown).

The package substrate 210 may also include electrically conductive elements or electrical routing features (not shown) configured to route electrical signals to or from the base die 212. The electrical routing features may be internal (e.g., disposed at least partially within a thickness of the package substrate 210) and/or external to the package substrate 210. For example, in some aspects, the package substrate 210 may include electrical routing features such as pads, vias, and/or traces configured to receive the interconnect structures and route electrical signals to or from the base die 212. The pads, vias, and traces can be constructed of the same or similar electrically conductive materials, or of different electrically conductive materials.

FIG. 2B shows an enlargement of the shielding assembly 250. As illustrated therein, the protrusions 260 may extend from the shielding assembly 250 in an aligned manner, meaning that for each protrusion 260 on the top surface of the shielding assembly 250 there may be a respective protrusion 260 aligned at the same position of the shielding assembly 250 at the bottom surface of the shielding assembly 250. In other words (and very simplified), the protrusions 260 may be symmetrically arranged in a mirror image on either side of the shielding assembly 250. These protrusions 260 may create a "wall" between neighboring solder balls, thereby reducing the crosstalk noise.

The thickness of the protrusions 260, i.e. the length of one protrusion along the bottom surface of the package substrate 210, may be in the range of approximately 0.1 mm to mm, or 0.15 mm to 0.25 mm, or approximately 0.2 mm.

The non-protruding parts of the shielding assembly 250 may form hollow parts in the midsection 252 of the shielding assembly that surround a plurality of spaces 254 on each side of the top surface and the bottom surface of the shielding assembly 250. Since the protrusions 260 of the top and the bottom surface of the shielding assembly 250 are aligned with each other, the spaces 254 on each side of the top surface and the bottom surface of the shielding assembly 250 are equally aligned. Each solder ball of the first plurality of solder balls 220 may be inserted into one of the spaces 254 (e.g., a cavity) formed by the protrusions 260 on the top surface of the shielding assembly 250. Similarly, each solder ball of the second plurality of solder balls 230 may be inserted into one of the spaces 254 (e.g., a cavity) formed by the protrusions 260 on the bottom surface of the shielding assembly 250. Since the spaces 254 on the top surface of the shielding assembly 250 are aligned with the spaces 254 on the bottom surface of the shielding assembly 250, each of the solder balls of the first plurality of solder balls 220 may be equally aligned with a corresponding solder ball of the second plurality of solder balls 230.

Each solder ball of the first plurality of solder balls 220 that is aligned with a corresponding solder ball of the second plurality of solder balls 230 may together form a coupled pair of solder balls 235. This coupled pair of solder balls 235 may be conductively connected via the midsection 252 of the shielding assembly. Since each coupled pair of solder balls 235 connects to the package substrate 210 on a top part thereof and to the motherboard 240 at a bottom part thereof, the coupled pair of solder balls 235 may establish a conductive connection between the package substrate 210 and the motherboard 240.

A first plurality of coupled pair of solder balls 280 may be associated with a ground reference voltage. This may be advantageous to provide electromagnetic interference shielding.

A second plurality of coupled pairs of solder balls 290 may be associated with signal data transmission (I/O). In one aspect, the second plurality of solder balls may also include coupled pairs of solder balls 290' that are associated with a power supply voltage. They may be configured to facilitate power delivery.

Since a coupled pair of solder balls 235 is used for generating the conductive connection, as opposed to a single solder ball, a diameter of each solder ball of the coupled pair of solder balls 235 may be smaller while retaining the same distance from the package substrate 210 to the motherboard 240. Retaining the same distance from the package substrate 210 to the motherboard 240 enables the semiconductor 200 to still fit into land side capacitors, while reducing the solder balls size and the ball pitch. Accordingly, the diameter of a solder ball in the first and second plurality of solder balls 220, 230 may range from approximately 0.1 to about 0.2 mm. In addition, in contrast to conventional systems, the shielding assembly 250 allows for electromagnetic interference shielding, thereby reducing the crosstalk between adjacent solder balls. In the combination with the above mentioned reduced diameter of adjacent solder balls of the coupled pair of solder balls 235, the shielding assembly 250 engages in a synergistic combination with the reduced diameter of each solder ball, which enables tighter packing of the solder balls. Accordingly, and advantageously, a distance between each coupled pair of solder balls 235 may be 0.6 mm or less, e.g. 0.4 mm to 0.6 mm, or 0.55 mm to 0.59 mm.

A material of the shielding assembly 250 (including the protrusions 260) may be selected from any conductive material. Such a conductive material may assist in establishing the conductive connection between each solder ball of the coupled pair of solder balls 235. The conductive material may include, but not be limited to, copper, aluminium, or a combination or an alloy thereof.

The protrusions 260 may be covered with an insulating layer 270, configured to insulate a solder ball from an adjacent solder ball. A material of the insulating layer 270 may include a non-conductive polymer, optionally an epoxy polymer. In some aspects, the material of the insulating layer 270 may include glass-reinforced epoxy, such as FR-4, polytetrafluoroethylene, cotton-paper reinforced epoxy, phenolic-glass, paper-phenolic, polyester-glass, Ajinomoto Build-up Film, bismaleimide-triazine epoxy resin, or any combination thereof. The thickness of the insulating layer 270, i.e. the length of one insulating layer along the bottom surface of the package substrate 210, may be in the range of approximately 0.01 mm to 0.1 mm, or 0.03 mm to 0.08 mm, or approximately 0.05 mm.

The shielding assembly 250 may have intentional separations 255 fracturing a horizontal conductive connection of the shielding assembly 250. The intentional separations are filled (e.g., covered) with the insulating layer 270 and may be formed adjacent to the coupled pairs solder balls of a second plurality of solder balls 290, 290'. Thus, the intentional separations 255 have the purpose of insulating each of the coupled pairs of solder balls of a second plurality of solder balls 290, 290' that is associated (primarily) with signal data transmission and (secondarily) with a power supply voltage from the coupled pairs of solder balls 280 associated the reference ground voltage. Accordingly, due to the intentional separations 255, each coupled pair solder balls 290, 290' that is associated with signal data transmission (or power supply voltage) is insulated from an adjacent coupled pair solder balls 290, 290' and from a coupled pair of solder balls 280. The intentional separations 255 may be positioned adjacent (e.g., lateral) to the protrusions 260 (where applicable) at a mid-level height of the shielding assembly 250, such that the protrusions 260 may represent the shape of an insulated pillar. In this context, "lateral" is meant to indicate a side of the protrusions 260 that is abutted to the midsection 252 of the shielding assembly.

The shielding assembly 250 itself may be partially associated with i) I/O and/or power supply voltage, and partially associated with ii) a ground reference voltage. The intentional separations 255 may separate the parts associated with I/O and/or power supply voltage from the parts associated with ground reference voltage. In particular, the shielding assembly 250 may be primarily connected to a ground reference voltage. However, since the intentional separations 255 insulate some of the midsections 252 of the shielding assembly 250 from its adjacent midsections associated with ground reference voltage, the coupled pair of solder balls 290, 290' are insulated from those parts of the shielding assembly 250 that are connected to a ground reference voltage. This is illustrated in FIG. 2B with a square in solid lines and one square in dotted lines. For example, the coupled pair of solder balls 292 is insulated by the intentional separation 255 from the adjacent protrusion 260d (highlighted with the square in solid lines), thereby cutting the connection to the ground reference voltage of the shielding assembly 250. In contrast, the absence of a respective intentional separation 255 between the midsection 252b and the protrusion 260c permits the connection between the midsection 252b to the protrusion 260c (indicated as the square in dotted lines), and thereby permitting the connection to the ground reference voltage of the shielding assembly 250.

FIG. 2C shows a bottom view of the arrangement of the plurality of solder balls of FIG. 2B. In detail, FIG. 2B is a cross-sectional view of the plurality of solder balls that are to be inserted into the spaces 254 of the shielding assembly 250 along a dotted line L shown in FIG. 2C. Accordingly, the solder balls identified as solder balls 291 and 292 may be associated with signal transmission or a power supply voltage while the solder ball identified as solder ball 281 may be associated with a ground reference voltage (Vss). As illustrated in FIG. 2B, the midsection 252a of the shielding assembly, configured to be interposed between the coupled pair of solder balls 291, may be separated from remaining parts of the shielding assembly 250, due to the employment of separations 255 (shown in solid black) disposed between the adjacent protrusions 260a, 260b and the midsection 252a of the shielding assembly. Hence, the coupled pair of solder balls 291 may be insulated from the adjacent protrusions 260a and 260b. Similarly, the coupled pair of solder balls 292 would be insulated from the adjacent protrusions for the same reason. Accordingly, the separation 252 advantageously reduces the crosstalk between the coupled pair of solder balls 291 and 292, thereby increasing electrical performance. In contrast, the midsection 252b of the shielding assembly interposed between the coupled pair of solder balls 281 that is associated with a ground reference voltage, is conductively coupled with the adjacent protrusions 260b and 260c. As shown in FIG. 2C, this shielding caused by the separation 252 enables a tighter packing of the second plurality of coupled pair of solder balls 290, associated with a power supply voltage, and a higher percentage of coupled pair of solder balls 290, 290' versus the first plurality of coupled pair of solder balls 280, associated with a ground reference voltage.

Figures 3A, 3B:
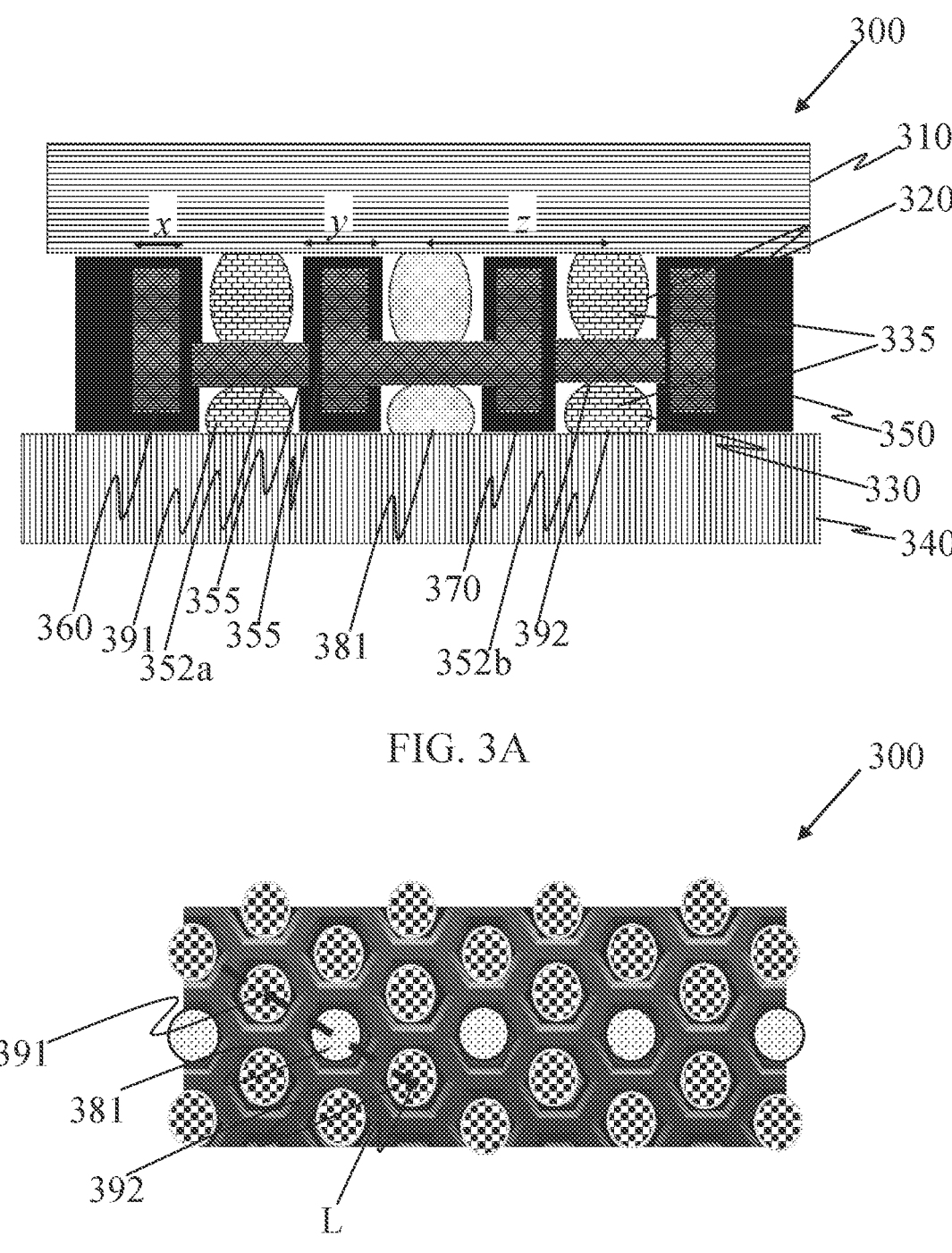
FIG. 3A illustrates a cross-sectional view of a semiconductor package in accordance with an aspect of the disclosure.
FIG. 3B illustrates a bottom view of a ball grid array of a semiconductor device in accordance with an aspect of the disclosure.

FIG. 3A is a cross-sectional view of a semiconductor package 300, according to other aspects of the present disclosure. FIG. 3B shows a bottom view of the arrangement of the plurality of solder balls of FIG. 3A. In detail, FIG. 3A is a cross-sectional view of the plurality of solder balls that are present in the shielding assembly 350 along a dotted line L shown in FIG. 3B. The semiconductor 300 includes a package substrate 310 to which a first plurality of solder balls 320 is affixed. A second plurality of solder balls 330 is connected to the motherboard. The semiconductor device 300 schematically shows a plurality of coupled pairs of solder balls 335, wherein each solder ball of the coupled pair of solder balls is aligned with the other solder ball of the coupled pair of solder balls on each side of the shielding assembly 350. Each coupled pair of solder balls 335 may be interposed between adjacent protrusions 360. A thickness of each of the protrusions 360 may be indicated as the length x, and may be about 0.2 mm. Each protrusion 360 may be covered with an insulating layer 370. A thickness of each of the protrusions 360 covered with the insulating layer 370 may be indicated as the length y, and may be about 0.3 mm. Accordingly, a thickness of the insulating layer 370 may be about 0.05 mm.

Some of the coupled pairs of solder balls 391, 392 may be associated with signal data transmission or a power supply voltage, while the coupled pair of solder ball 381 may be associated with a ground reference voltage. As illustrated previously in FIG. 2B, the coupled pairs of solder balls 391, 392 associated with signal data transmission or a power supply voltage are insulated from the adjacent coupled pair of solder balls 380, since the midsections 352a and 352b of the shielding assembly are insulated from the remaining part of the shielding assembly by separations 355. As mentioned, this separation may result in a tighter packing of the coupled pairs of solder balls 335, such that a distance z of one solder ball of the first or the second plurality of solder balls 320, 330 from an adjacent solder ball of the first or the second plurality 320, 330 may be reduced. As indicated in FIG. 3A, such a distance (e.g., ball pitch) may be indicated as the length z, and may be about 0.55 to 0.59 mm. In contrast to the conventional semiconductor 100 illustrated in FIG. 1A, the semiconductor 300 according to the disclosure advantageously provides improved utilization of the open space 114, by disposing a shielding assembly 350 into the open space 114, which allows a tighter packing (i.e. a reduced ball pitch) of the solder balls and a higher percentage of coupled pairs of solder balls 390, 390' associated with signal data transmission or a power supply voltage. These advantages translate into a smaller footprint of the semiconductor package 300, thereby facilitating the miniaturization of the semiconductor package 300.

As illustrated in FIG. 3A, in one aspect, the solder balls of the first plurality of solder balls 320 may be bigger (e.g., longer) than the solder balls of the second plurality of solder balls 330. Advantageously, this may facilitate the manufacturing of the second plurality of solder balls 330. For example, it may be possible to affix the solder balls of the second plurality of solder balls 330 by disposing a solder paste to produce the solder balls plurality of solder balls 330.

Figures 4A, 4B:
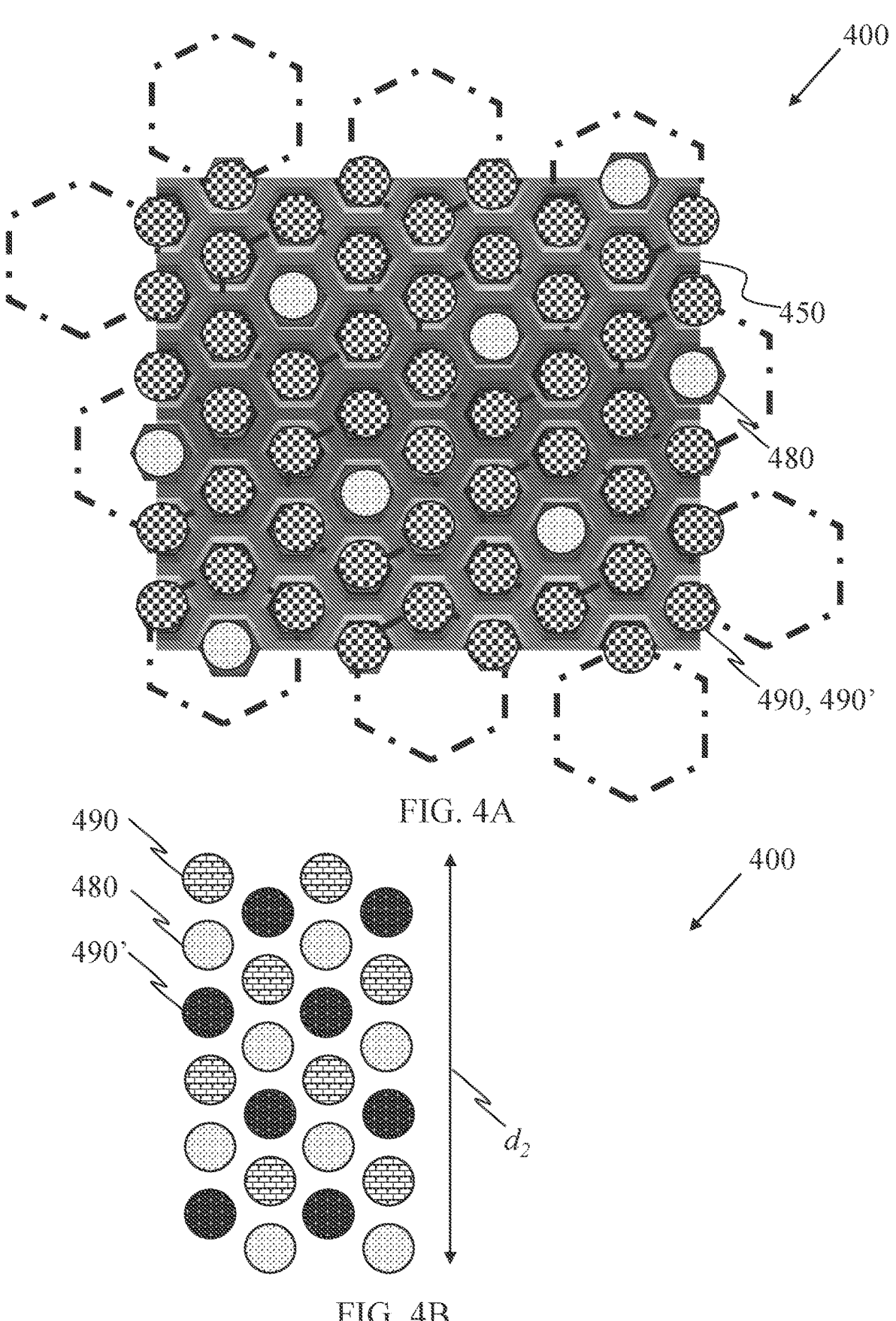
FIG. 4A illustrates a bottom view of a ball grid array of a semiconductor device in accordance with an aspect of the disclosure.
FIG. 4B illustrates a bottom view of a ball grid array of a semiconductor device in accordance with an aspect of the disclosure.

FIG. 4A is a bottom view of a ball grid array of a semiconductor device 400 in accordance with an aspect of the disclosure and FIG. 4B illustrates another bottom view of a ball grid array of a semiconductor device in accordance with an aspect of the disclosure.

Referring to FIGS. 4A and 4B, the semiconductor package 400 includes most of the elements of the semiconductor packages 200 and 300 of FIGS. 2A, 2B 2C, 3A, and 3B.

FIG. 4A shows an arrangement of a first plurality of coupled pairs of solder balls 480 versus a second plurality of coupled pairs of solder balls 490, 490'. As mentioned, by employing the shielding assembly 450, it is possible to increase the percentage of coupled pairs of solder balls 490, 490' associated with signal data transmission or a power supply voltage, as opposed to coupled pairs of solder balls 480 associated with a ground reference voltage. The percentage of coupled pairs of solder balls 490, 490' associated with signal data transmission or a power supply voltage, as opposed to coupled pairs of solder balls 480 associated with a ground reference voltage, may be expressed in a predetermined number of coupled solder balls 490, 490' that are associated with the signal data transmission or power supply voltage that surround each coupled pair of solder balls 480 associated with the ground reference voltage. The higher the predetermined number, the higher the percentage of coupled pairs of solder balls 490, 490' associated with signal data transmission or a power supply voltage. In one example, the predetermined number may be greater than 1, such as 2, 3, 4, 5, 6 or higher. In one aspect, with reference to FIG. 4A, each coupled pair of solder balls 480 associated with the ground reference voltage may be surrounded by six coupled pairs of solder balls 490, 490' associated with signal data transmission or a power supply voltage, hence the predetermined number may be 6. In some aspects, each coupled pair of solder balls 480 associated with the ground reference voltage may be surrounded by six coupled pairs of solder balls 490, 490' associated with signal data transmission. The pattern in which the coupled pair of solder balls 480 are surrounded by the coupled pairs of solder balls 490 associated with signal data transmission may be described as a "honeycomb" pattern, wherein each coupled solder ball 490 surrounds one coupled solder ball 480 in a substantially hexagonal pattern. The plurality of coupled pairs of solder balls 490 may thus form a hexagon (indicated in dotted lines) around each coupled pair of solder balls 480. Accordingly, the ratio of "signal (signal data transmission) to ground (ground reference voltage)", in some aspects, may be 6:1. This high ratio of solder balls 490 has the advantage of reducing or eliminating the open space 114 indicated in FIG. 1A, which is present in conventional semiconductor packages. Moreover, the high ratio of solder balls 490, 490' has the advantage of reducing the footprint of the semiconductor package 400, thereby facilitating miniaturization of the semiconductor package 400.

FIG. 4B further illustrates the arrangement of the plurality of coupled pairs of solder balls 435. In one aspect, each coupled pair of solder balls 480 may be surrounded by six coupled pairs of solder balls 490, 490' in a hexagonal arrangement. The reduction in footprint is indicated with the length $d_2$, which is about 3.5 mm.

In another aspect, there is provided a method 500 for forming the semiconductor package of the present disclosure. FIG. 5 shows a simplified flow diagram for an exemplary method for making a semiconductor package with a shielding assembly according to an aspect of the present disclosure.

The operation 501 may be directed to forming a shielding assembly, the formation of the shielding assembly including providing a shielding layer with a top surface and a bottom surface and forming a first plurality of cavities in the top surface and an aligned second plurality of cavities in the bottom surface of the shielding layer, wherein a plurality of protrusions remain between the cavities.

The operation 502 may be directed to filling the cavities with an insulating material.

The operation 503 may be directed to partially removing the insulating material, wherein the insulating material that remains forms an insulating layer surrounding each of the protrusions.

The operation 504 may be directed to affixing a second plurality of solder balls into the second plurality of cavities formed in the bottom surface of the shielding layer.

The operation 505 may be directed to affixing the shielding assembly to a first plurality of solder balls coupled to a bottom surface of a package substrate such that each of the protrusions on the top surface of the shielding assembly expands into a space between adjacent solder balls of the first plurality of solder balls.

Figures 6A, 6B, 6C, 6D, 6E:
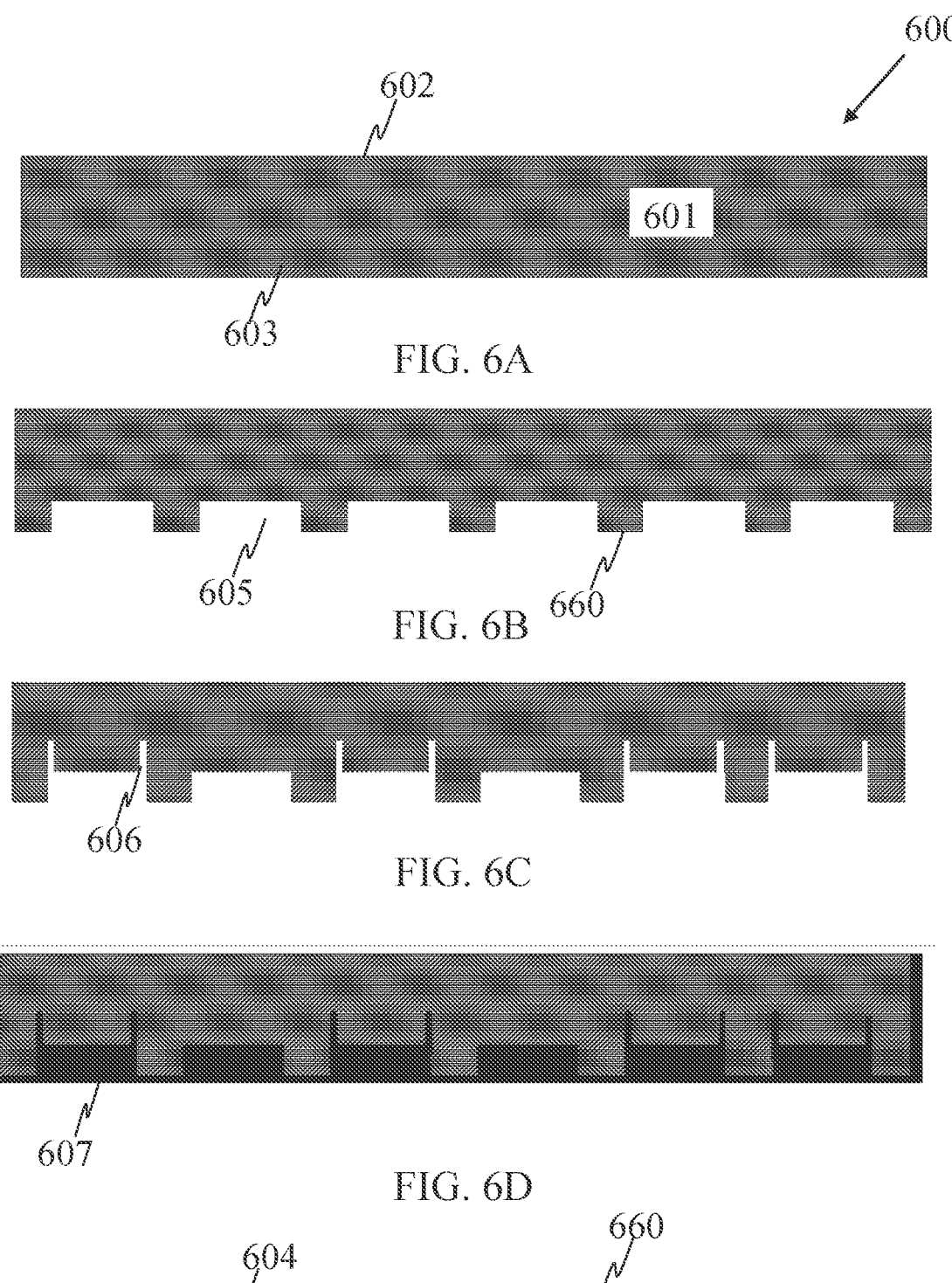
FIG. 6A to FIG. 6H illustrate a process for making the semiconductor package in accordance with an aspect of the disclosure.
Figure 6F:
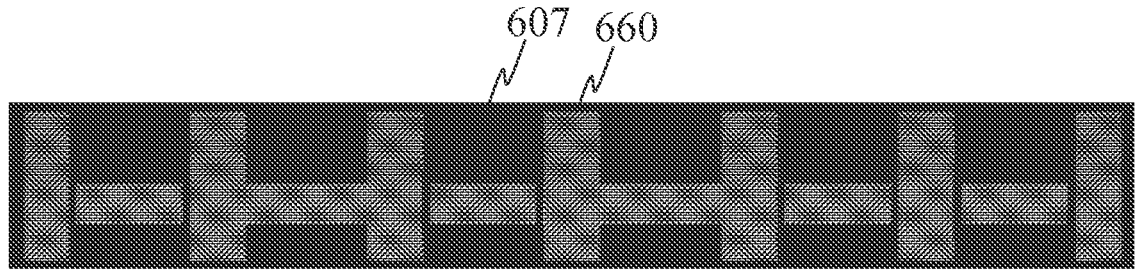
Figure 6G:
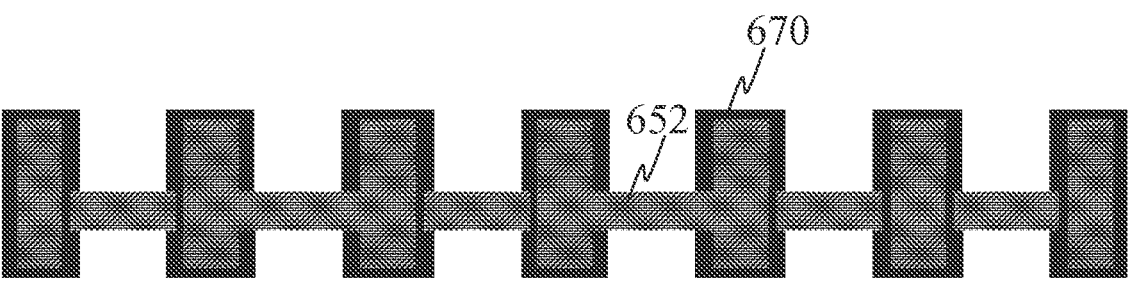
Figure 6H:
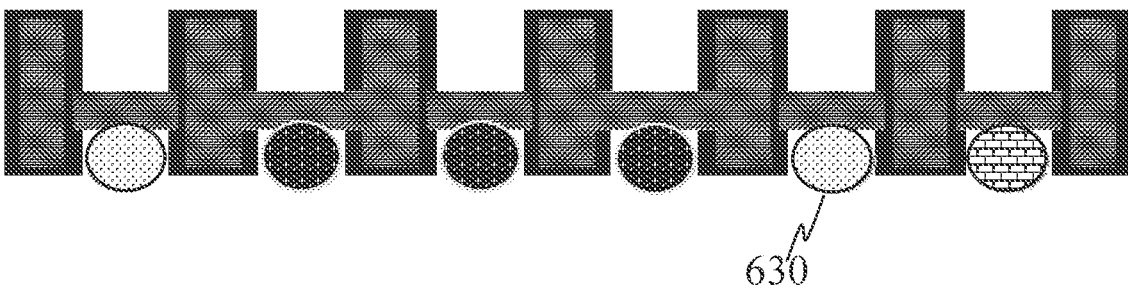

FIG. 6A to 6H illustrates the method of forming the shielding assembly 650. The formation of the shielding assembly 650 may include providing a shielding layer 601 with a top surface 602 and a bottom surface 603. The shielding layer 601 may include, e.g., a copper foil (FIG. 6A). The formation of the shielding assembly 650 may subsequently include forming a second plurality of cavities 605 in the bottom surface 603 of the shielding layer 601, wherein the remaining part of the shielding layer may form protrusions 660. The formation of the cavities 605 may be carried out by an etching method, e.g., by a process involving dry litho patterning followed by a copper half etching, followed by dry film stripping (FIG. 6B). The formation of the shielding assembly 650 may subsequently include forming hollow separations 606 in the shielding assembly 650 by removing material of the shielding layer 601 adjacent to some of the protrusions 660, wherein the hollow separations 606 expand substantially perpendicular to the shielding layer 601. The formation of the hollow separations 606 may be carried out by copper trench etching, e.g., by a process involving dry litho patterning followed by a copper trench etching, followed by dry film stripping (FIG. 6C). The formation of the shielding assembly 650 may subsequently include filling the cavities 605 and the hollow separations 606 with an insulating material 607. This step may be carried out by molding (FIG. 6D). The formation of the shielding assembly 650 may subsequently include forming a first plurality of cavities 604 in the top surface 602 of the shielding layer 601, wherein the remaining part of the shielding layer may form protrusions 660. The formation of the cavities 604 may be carried out by an etching method, e.g., by a process involving dry litho patterning followed by a copper half etching, followed by dry film stripping (FIG. 6E). The cavities 604 may be formed to be aligned with cavities 603, i.e., they may be at the same position of the shielding layer 601 to each other. The formation of the shielding assembly 650 may subsequently include filling the cavities 604 with the insulating material 607, e.g., by a second molding process (FIG. 6F). The formation of the shielding assembly 650 may subsequently include partially removing the insulating material 607, wherein the insulating material 607 that remains forms an insulating layer 670 surrounding each of the protrusions 660. This step may be carried out, e.g., by laser drilling (e.g., $CO_2$ laser drilling), which may expose a midsection 652 of the shielding layer (e.g., a copper pad) from both the top surface 602 and the bottom surface 603 of the shielding layer 601 (FIG. 6G) to give the shielding assembly 650.

Subsequently, a second plurality of solder balls 630 may be affixed to the bottom surface 603 of the shielding assembly 650, in particular to a bottom surface of the midsection 652 of the shielding assembly 650. The affixing of the solder balls may be carried out, e.g., by solder attachment on the midsection 652 of the shielding assembly 650. The second plurality of solder balls 630 may include both solder balls that are associated with i) signal data transmission or a power supply voltage and solder balls that are associated with ii) a ground reference voltage.

Figures 7A, 7B:
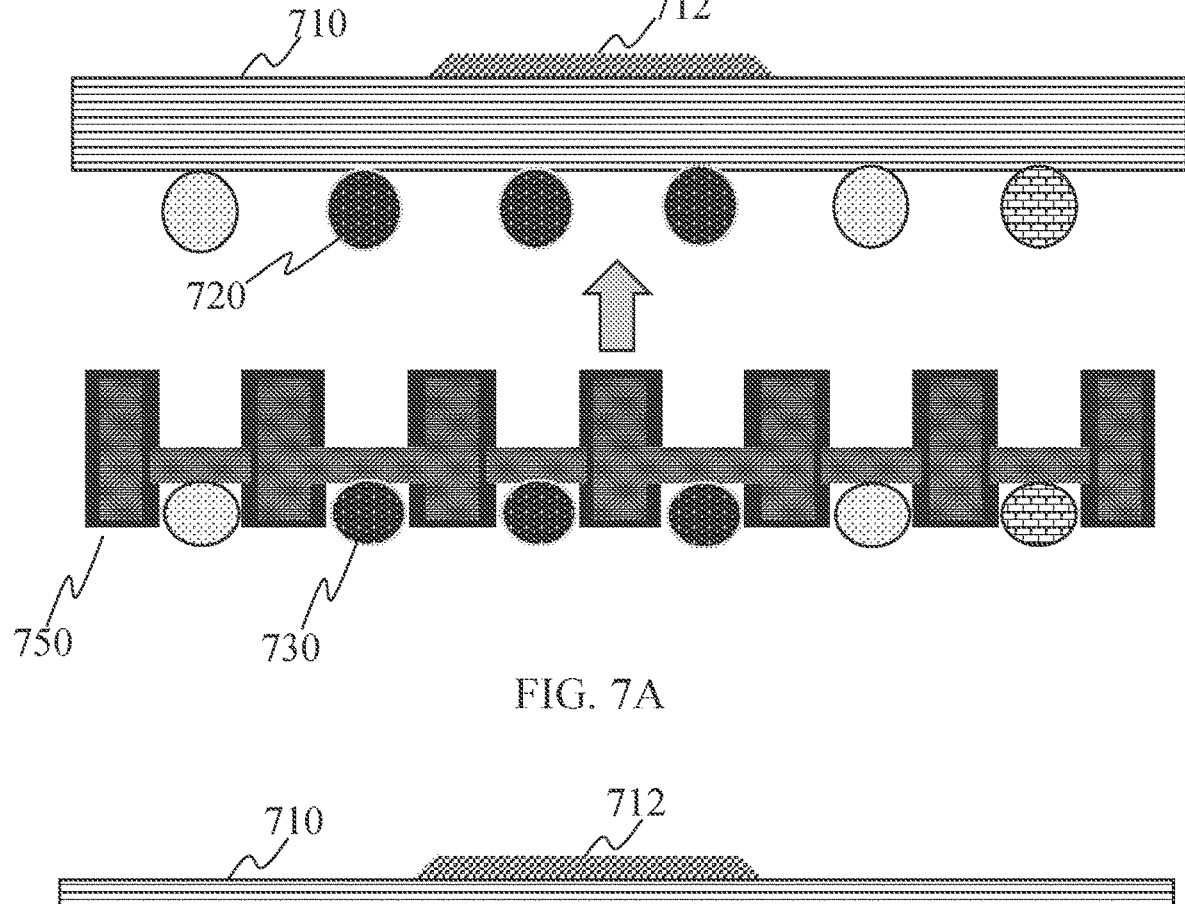
FIG. 7A to FIG. 7D illustrate a process for making the semiconductor package in accordance with an aspect of the disclosure.
Figures 7C, 7D:
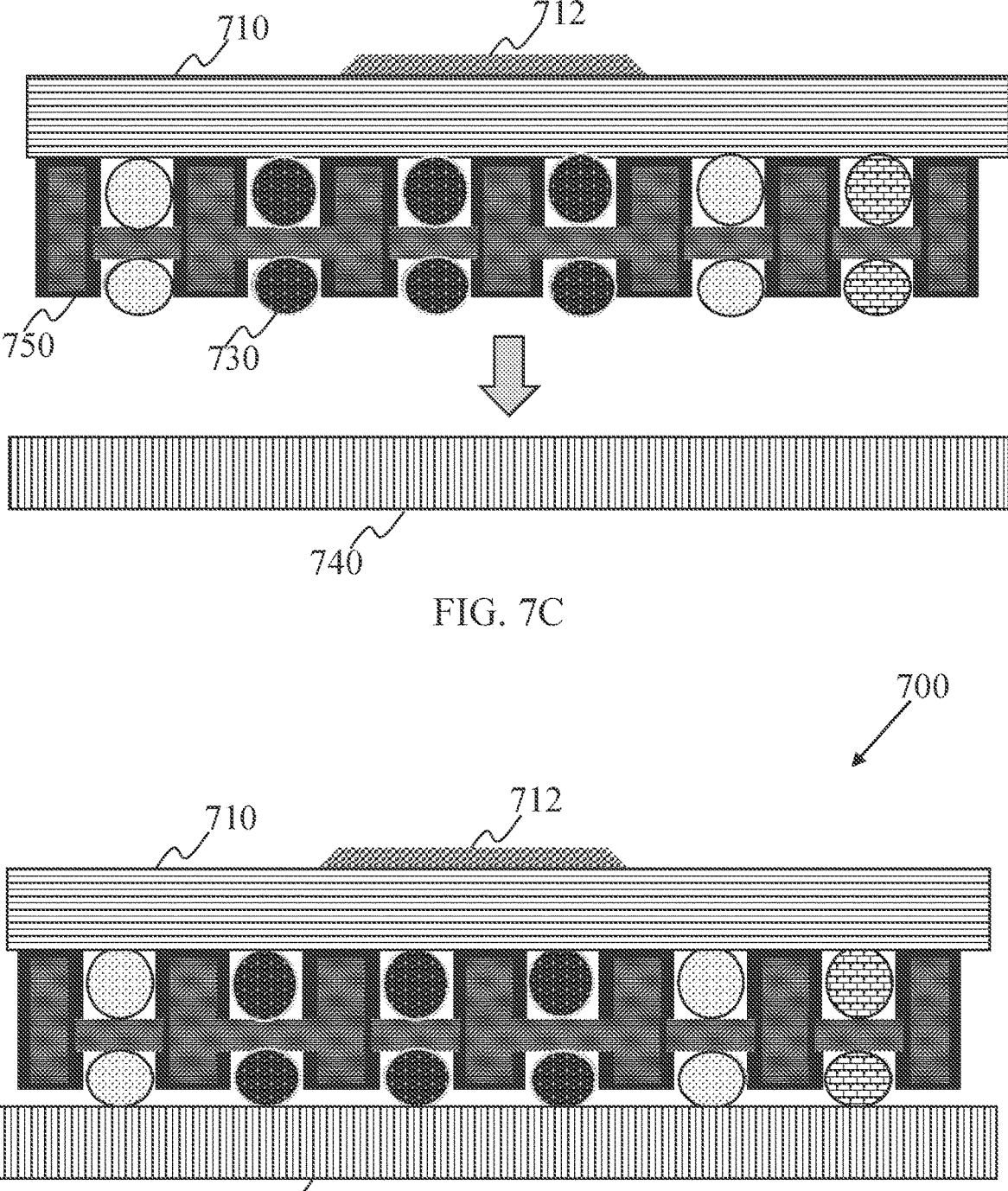

With reference to FIG. 7A to FIG. 7D, subsequent method steps are described in method 700. Method 700 may involve attaching the shielding assembly 750 including the second plurality of solder balls 730 to a package substrate 710 including a first plurality of solder balls 720 (FIG. 7A), resulting in the arrangement as shown in FIG. 7B. This step may be followed by attaching the second plurality of solder balls 730, including the shielding assembly 750, the first plurality of solder balls 720 and the package 710, to a motherboard 740 (FIG. 7C), resulting in the formation of the semiconductor package (FIG. 7D).

Figures 8A, 8B:
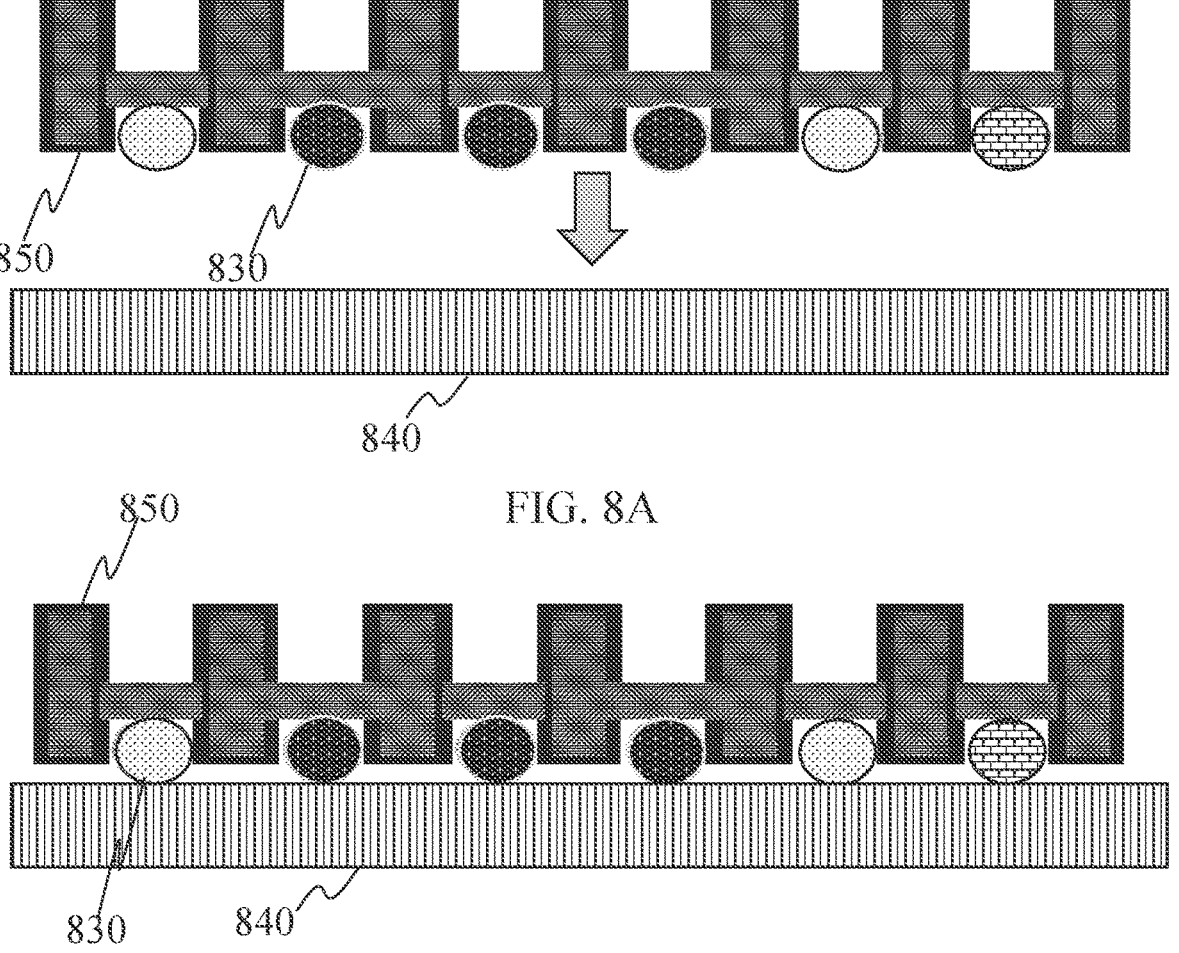
FIG. 8A to FIG. 8D illustrate a process for making the semiconductor package in accordance with an aspect of the disclosure.
Figure 8C:
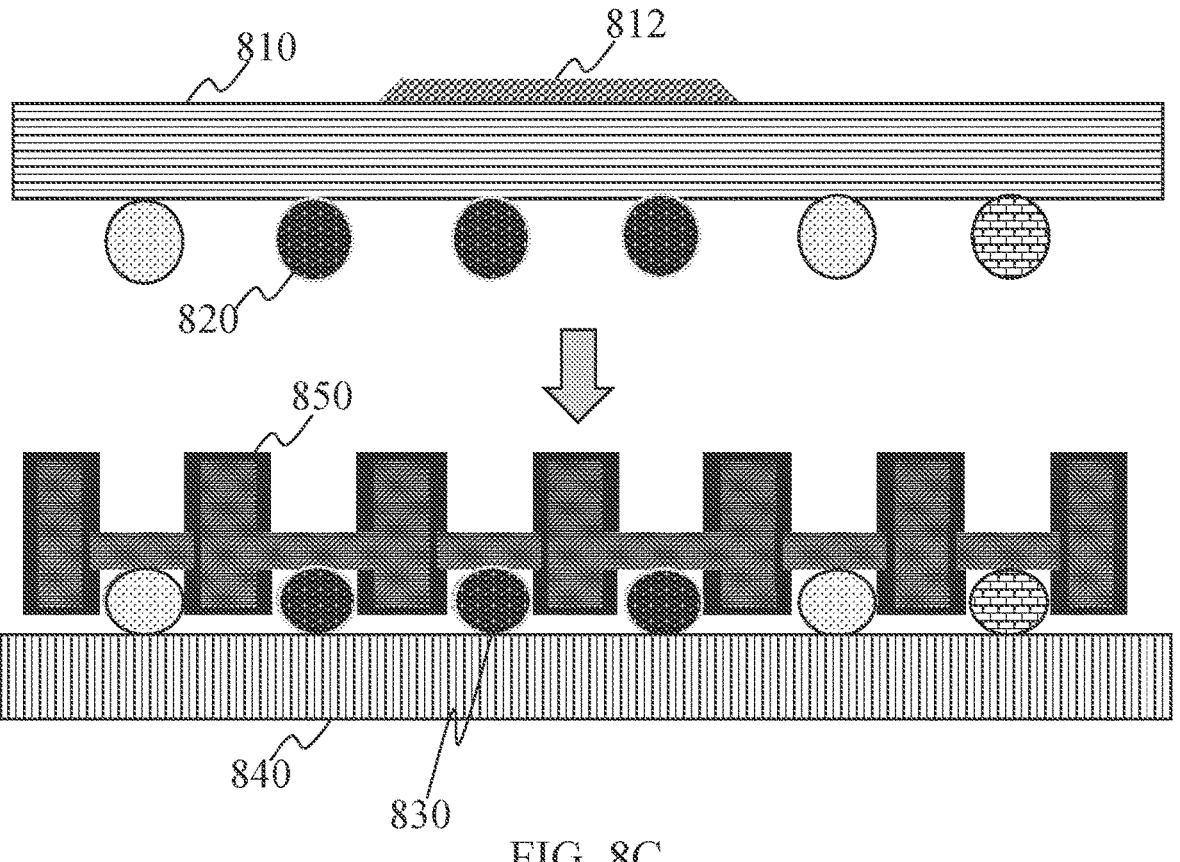
Figure 8D:
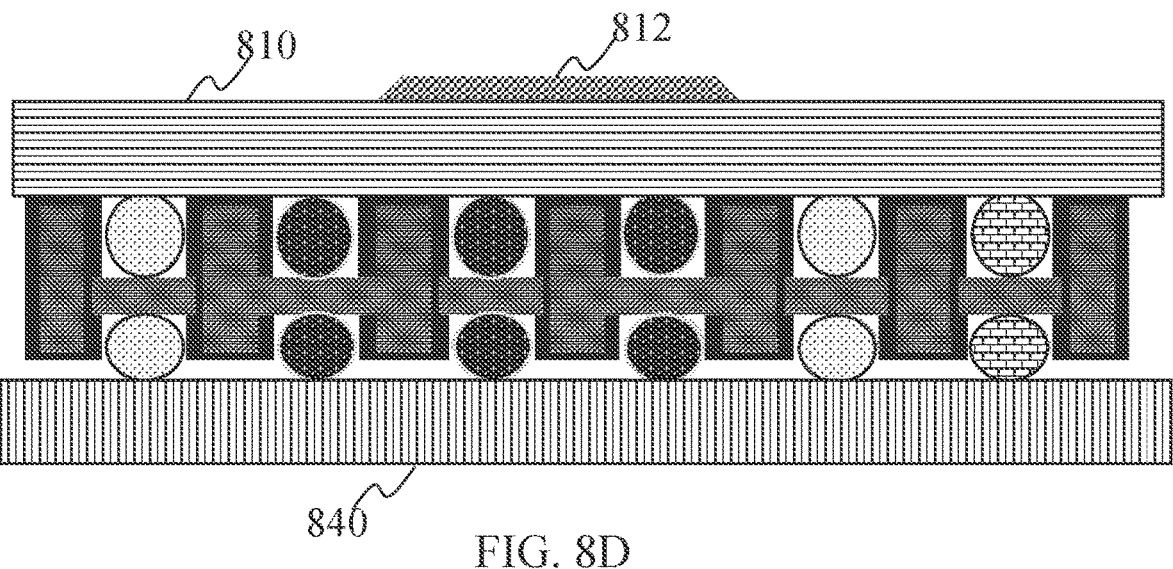

An alternative method 800 for assembly of the shielding assembly 850 with the package substrate 810 including a first plurality of solder balls 820, a second plurality of solder balls 830 and a motherboard 840 is shown in FIG. 8A to FIG. 8D. In this method 800, a motherboard 840 may be affixed first to the second plurality of solder balls 830 affixed to the shielding assembly 850 (FIG. 8A) to give the assembly of FIG. 8B. Subsequently, a package substrate 810 including a first plurality of solder balls 820 may be affixed to the shielding assembly 850, such that each solder ball of the first plurality of solder balls 820 may be aligned with each solder ball of the second plurality of solder balls 830 (FIG. 8C) resulting in the formation of the semiconductor package (FIG. 8D).

The fabrication methods and the choice of materials presented above are intended to be exemplary for forming the present semiconductor packages. It will be apparent to those ordinary skilled practitioners that the foregoing process operations may be modified without departing from the spirit of the present disclosure.

Further aspects of the disclosure and advantages described for the semiconductor package 200 of the previous aspect can be analogously valid for the methods 500, 600, 700 and 800, and vice versa. As the various features, material properties and advantages have already been described above and in the examples demonstrated herein, they shall not be iterated for brevity where possible.

Figure 9:
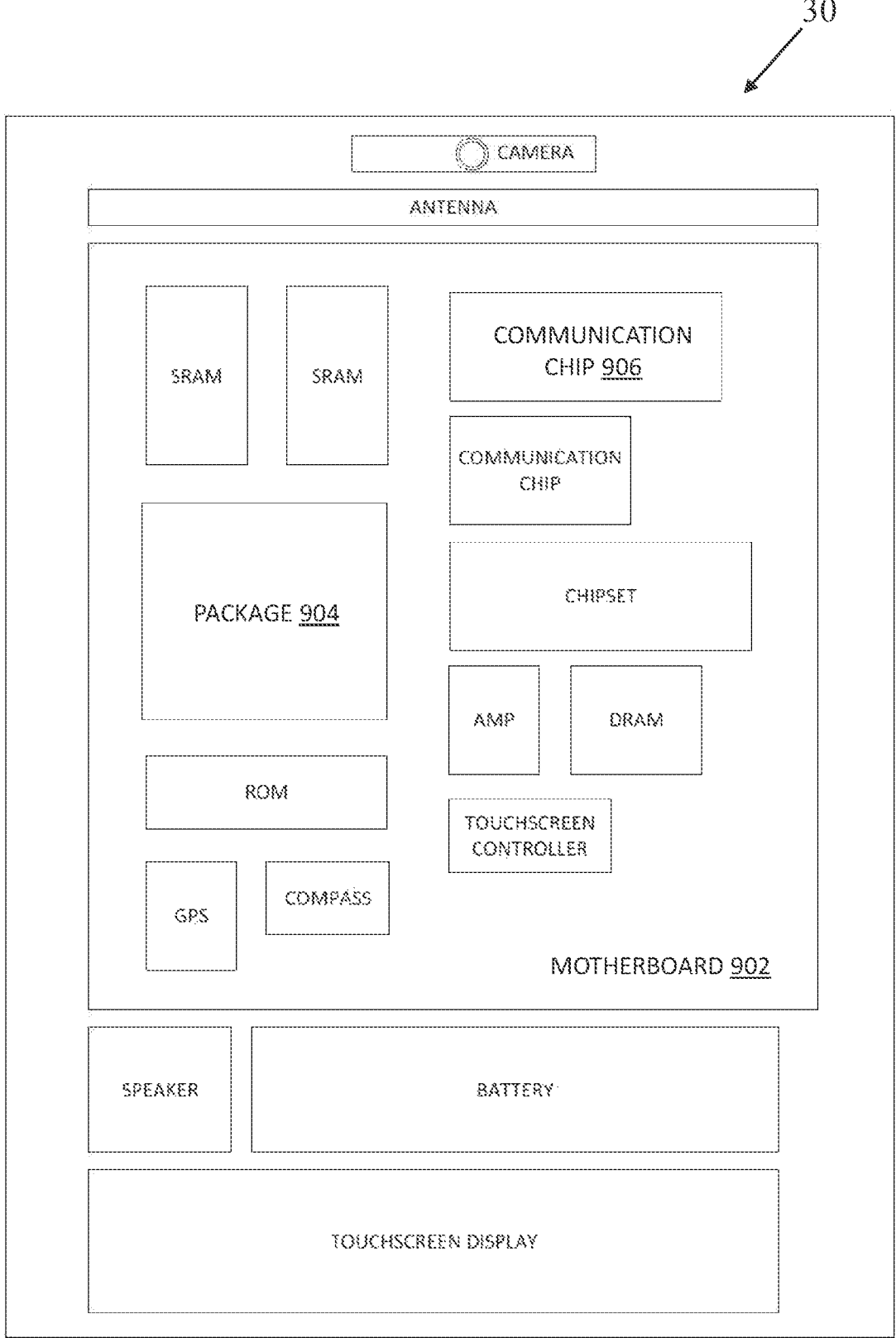
FIG. 9 shows an illustration of a computing device that includes a present semiconductor package according to a further aspect of the present disclosure.

Aspects of the present disclosure may be implemented into a system using any suitable hardware and/or software. FIG. 9 schematically illustrates a computing device 30 that may include a semiconductor package as described herein, in accordance with some aspects. According to the present disclosure, the computer device 30 may include a printed circuit board, a semiconductor package, which has a package substrate with a shielding assembly.

Accordingly, there may be provided a computing device 30. The computing device may include a motherboard; and a semiconductor package coupled to the motherboard. The semiconductor package may include: a package substrate including a bottom surface; a first plurality of solder balls connected to the bottom surface of the package substrate; a second plurality of solder balls connected to the motherboard; and a shielding assembly interposed between the first and the second plurality of solder balls, wherein the first plurality of solder balls is disposed on a top surface of the shielding assembly and the second plurality of solder balls is disposed on a bottom surface of the shielding assembly, wherein each of the solder balls of the first plurality of solder balls is oppositely aligned with a corresponding solder ball of the second plurality of solder balls to form a coupled pair of solder balls; wherein the shielding assembly may include a plurality of protrusions extending from a top surface and from a bottom surface of the metal layer into a space between each solder ball of the first and second plurality of solder balls; wherein each protrusion of the plurality of protrusions is covered with an insulating layer configured to insulate each of the solder balls of the first and the second plurality of solder balls.

Further aspects of the disclosure and advantages described for the semiconductor package 200 of the previous aspect can be analogously valid for the computing device, and vice versa. As the various features, material properties and advantages have already been described above and in the examples demonstrated herein, they shall not be iterated for brevity where possible.

In another aspect, the computing device 30 may house a board such as a motherboard 902. The motherboard 902 may include a number of components, including, but not limited to, a semiconductor package and at least one communication chip 906. The semiconductor package according to the present disclosure may be physically and electrically coupled to the motherboard 902. In some implementations, the at least one communication chip 906 may also be physically and electrically coupled to the motherboard 902. In further implementations, the communication chip 906 may be part of a semiconductor package.

Depending on its applications, computing device 30 may include other components that may or may not be physically and electrically coupled to the motherboard 902. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the semiconductor package of the computing device 30 may include a stiffener, as described herein.

The communication chip 906 may enable wireless communications for the transfer of data to and from the computing device 30. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 906 may implement any of a number of wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 906 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 902 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 906 may operate in accordance with other wireless protocols in other aspects.

The computing device 30 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

In various implementations, the computing device 30 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 30 may be a mobile computing device. In further implementations, the computing device 30 may be any other electronic device that processes data.

In a first example, there is a semiconductor package including a package substrate including a bottom surface; a first plurality of solder balls connected to the bottom surface of the package substrate; a second plurality of solder balls connected to a motherboard; and a shielding assembly interposed between the first and the second plurality of solder balls, wherein the first plurality of solder balls is disposed on a top surface of the shielding assembly and the second plurality of solder balls is disposed on a bottom surface of the shielding assembly, wherein each of the solder balls of the first plurality of solder balls may be oppositely aligned with a corresponding solder ball of the second plurality of solder balls to form a coupled pair of solder balls; wherein the shielding assembly may include a plurality of protrusions extending from a top surface and from a bottom surface of the metal layer into a space between each solder ball of the first and second plurality of solder balls; wherein each protrusion of the plurality of protrusions may be covered with an insulating layer configured to insulate each of the solder balls of the first and the second plurality of solder balls.

In a second example, a first plurality of the coupled pair of solder balls of Example 1 may be associated with a ground reference voltage and a second plurality of the coupled pair of solder balls may be associated with a signal data transmission or a power supply voltage.

In a third example, more than half of the coupled pairs of solder balls of Example 1 or Example 2 may be associated with the signal data transmission or the power supply voltage.

In a fourth example, the first plurality of the coupled pair of solder balls of Example 2 or Example 3 may be in electrical contact with adjacent protrusions.

In a fifth example, the second plurality of the coupled pair of solder balls of any one of the Examples 2 to 4 may be insulated from electrical contact with adjacent protrusions.

In a sixth example, each coupled solder ball of any one of the Examples 2 to 5 that is associated with the ground reference voltage may be surrounded by a predetermined number of coupled solder balls that are associated with the signal data transmission or the power supply voltage.

In a seventh example, the metal layer of any one of the Examples 2 to 5 may include copper, aluminium, or a combination thereof.

In an eighth example, the insulating layer of any one of the Examples 1 to 7 may include a polymer and other non-conductive materials.

In a ninth example, a distance between each coupled pairs of solder balls of any one of the Examples 1 to 8 may be 0.6 mm or less.

In a tenth example, each protrusion of the plurality of protrusions of any one of the Examples 1 to 9 may have a thickness being in the range of approximately 0.1 mm to 0.3 mm.

In an eleventh example, there is provided a method. The method may include forming a shielding assembly, the formation of the shielding assembly including providing a shielding layer with a top surface and a bottom surface; and forming a first plurality of cavities in the top surface and an aligned second plurality of cavities in the bottom surface of the shielding layer, in which a plurality of protrusions remain between the cavities; filling the cavities with an insulating material; and partially removing the insulating material, in which the insulating material that remains forms an insulating layer surrounding each of the protrusions; and affixing a second plurality of solder balls into the second plurality of cavities formed in the bottom surface of the shielding layer; and affixing the shielding assembly to a first plurality of solder balls coupled to a bottom surface of a package substrate such that each of the protrusions on the top surface of the shielding assembly may expand into a space between adjacent solder balls of the first plurality of solder balls.

In a twelfth example, the method of Example 11 may further include affixing the second plurality of solder balls that are affixed to the shielding assembly to a motherboard before the shielding assembly is assembled to the first plurality of solder balls coupled to a bottom surface of a package substrate.

In a thirteenth example, the method of Example 11 may further include assembling the second plurality of solder balls of the shielding assembly including the package substrate to a motherboard.

In a fourteenth example, the method of any one of the Examples 11 to 13 may further include forming hollow separations in the shielding assembly by removing material of the shielding layer adjacent to some of the protrusions and filling the hollow separations with the insulating material, wherein the separations expand substantially perpendicular to the shielding layer.

In a fifteenth example, the first plurality of cavities of any one of the Example 11 to 14 may be formed and filled with the insulating material before forming the second plurality of cavities and filling the second plurality of cavities with the insulating material, followed by the partial removal of the insulating material to form the insulating layer.

In a sixteenth example, the shielding layer of any of the Examples 11 to 15 may include a material that includes copper, aluminium, or a combination thereof.

In a seventeenth example, a distance between the solder balls of the first or the second plurality of solder balls of any of the Examples 11 to 16 may be 0.6 mm or less.

In an eighteenth example, each protrusion of the plurality of the protrusions of any of the Examples 11 to 17 may have a thickness of about 0.1 mm to about 0.3 mm.

In a nineteenth example, there is provided a computing device, including: a motherboard; and a semiconductor package which may be coupled to the motherboard, the semiconductor package including: a package substrate including a bottom surface; a first plurality of solder balls connected to the bottom surface of the package substrate; a second plurality of solder balls connected to the mother-board; and a shielding assembly interposed between the first and the second plurality of solder balls, wherein the first plurality of solder balls is disposed on a top surface of the shielding assembly and the second plurality of solder balls is disposed on a bottom surface of the shielding assembly, wherein each of the solder balls of the first plurality of solder balls is oppositely aligned with a corresponding solder ball of the second plurality of solder balls to form a coupled pair of solder balls; wherein the shielding assembly includes a plurality of protrusions extending from a top surface and from a bottom surface of the metal layer into a space between each solder ball of the first and second plurality of solder balls; wherein each protrusion of the plurality of protrusions is covered with an insulating layer configured to insulate each of the solder balls of the first and the second plurality of solder balls.

In a twentieth example, a distance between each coupled pairs of solder balls of Example 19 may be 0.6 mm or less.

The dimensions of the semiconductor package and the choice of materials presented above are intended to be exemplary for forming the semiconductor package. It will be apparent to those ordinary skilled practitioners that the foregoing process operations may be modified without departing from the spirit of the present disclosure.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

By "about" or "approximately" in relation to a given numerical value, such as for thickness and height, it is meant to include numerical values within 10% of the specified value.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor package comprising:

a package substrate comprising a bottom surface; a first plurality of solder balls connected to the bottom surface of the package substrate; a second plurality of solder balls connected to a motherboard; and a shielding assembly interposed between the first and the second plurality of solder balls, wherein the first plurality of solder balls is disposed on a top surface of the shielding assembly and the second plurality of solder balls is disposed on a bottom surface of the shielding assembly, wherein each of the solder balls of the first plurality of solder balls is oppositely aligned with a corresponding solder ball of the second plurality of solder balls to form a coupled pair of solder balls;

wherein the shielding assembly comprises a plurality of protrusions extending from a top surface and from a bottom surface of the metal layer into a space between each solder ball of the first and second plurality of solder balls; wherein each protrusion of the plurality of protrusions is covered with an insulating layer configured to insulate each of the solder balls of the first and the second plurality of solder balls.

2. The semiconductor package of claim 1, wherein a first plurality of the coupled pair of solder balls are associated with a ground reference voltage and a second plurality of the coupled pair of solder balls are associated with a signal data transmission or a power supply voltage.

3. The semiconductor package of claim 2, wherein more than half of the coupled pairs of solder balls are associated with the signal data transmission or the power supply voltage.

4. The semiconductor package of claim 2, wherein the first plurality of the coupled pair of solder balls are in electrical contact with adjacent protrusions.

5. The semiconductor package of claim 2, wherein the second plurality of the coupled pair of solder balls are insulated from electrical contact with adjacent protrusions.

6. The semiconductor package of claim 2, wherein each coupled solder ball that is associated with the ground reference voltage is surrounded by a predetermined number of coupled solder balls that are associated with the signal data transmission or the power supply voltage.

7. The semiconductor package of claim 1, wherein the metal layer comprises copper, aluminium, or a combination thereof.

8. The semiconductor package of claim 1, wherein the insulating layer comprises a polymer and other non-conductive materials.

9. The semiconductor package of claim 1, wherein a distance between each coupled pairs of solder balls is 0.6 mm or less.

10. The semiconductor package of claim 1, wherein each protrusion of the plurality of protrusions have a thickness in the range of approximately 0.1 mm to 0.3 mm.

11. A computing device, comprising:

a motherboard; semiconductor package comprising a package substrate comprising a bottom surface; a first plurality of solder balls connected to the bottom surface of the package substrate; a second plurality of solder balls connected to the motherboard; and a shielding assembly interposed between the first and the second plurality of solder balls, wherein the first plurality of solder balls is disposed on a top surface of the shielding assembly and the second plurality of solder balls is disposed on a bottom surface of the shielding assembly, wherein each of the solder balls of the first plurality of solder balls is oppositely aligned with a corresponding solder ball of the second plurality of solder balls to form a coupled pair of solder balls;

wherein the shielding assembly comprises a plurality of protrusions extending from a top surface and from a bottom surface of the metal layer into a space between each solder ball of the first and second plurality of solder balls; wherein each protrusion of the plurality of protrusions is covered with an insulating layer configured to insulate each of the solder balls of the first and the second plurality of solder balls.

12. The computing device of claim 11, wherein a distance between each coupled pairs of solder balls is 0.6 mm or less.

* * * * *